(12) United States Patent
Zundel et al.

(10) Patent No.: US 8,653,591 B2
(45) Date of Patent: Feb. 18, 2014

(54) SEMICONDUCTOR COMPONENT ARRANGEMENT AND METHOD FOR PRODUCING THEREOF

(75) Inventors: Markus Zundel, Egmating (DE); Norbert Krischke, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 13/570,710

(22) Filed: Aug. 9, 2012

(65) Prior Publication Data

US 2012/0299092 A1 Nov. 29, 2012

Related U.S. Application Data

(62) Division of application No. 13/193,116, filed on Jul. 28, 2011, now abandoned, which is a division of application No. 11/771,375, filed on Jun. 29, 2007, now abandoned.

(30) Foreign Application Priority Data

Jul. 3, 2006 (DE) .......................... 10 2006 030 631

(51) Int. Cl.
*H01L 29/66* (2006.01)

(52) U.S. Cl.
USPC .................... 257/331; 257/334; 257/E29.031

(58) Field of Classification Search
USPC ............ 257/343, 334, 408, 344, 52, E29.031, 257/E29.045, E29.119, E29.12, E29.187, 257/E21.373, E21.428, E21.455, E27.091, 257/E29.201
See application file for complete search history.

(56) References Cited

U.S. PATENT DOCUMENTS

| 5,108,938 A | 4/1992 | Solomon |
| 5,378,655 A | 1/1995 | Hutchings et al. |
| 5,972,754 A | 10/1999 | Ni et al. |

(Continued)

FOREIGN PATENT DOCUMENTS

| DE | 10258467 | 9/2004 |
| DE | 102004005775 | 8/2005 |

(Continued)

OTHER PUBLICATIONS

Office Action relative to U.S. Appl. No. 11/771,375 mailed Aug. 20, 2009.

(Continued)

*Primary Examiner* — Cuong Q Nguyen
*Assistant Examiner* — Yosef Gebreyesus
(74) *Attorney, Agent, or Firm* — Dicke, Billig & Czaja, PLLC

(57) ABSTRACT

A semiconductor component arrangement and method for producing thereof is disclosed. One embodiment provides at least one power semiconductor component integrated in a semiconductor body and at least one logic component integrated in the semiconductor body. The logic component includes a trench extending into the semiconductor body proceeding from a first side, at least one gate electrode arranged in the trench and insulated from the semiconductor body by a gate dielectric, and at least one source zone and at least one drain zone of a first conduction type, which are formed in the semiconductor body in a manner adjacent to the gate dielectric and in a manner spaced apart from one another in a peripheral direction of the trench and between which at least one body zone of a second conduction type is arranged.

12 Claims, 7 Drawing Sheets

(56) References Cited

U.S. PATENT DOCUMENTS

| | | | |
|---|---|---|---|
| 6,037,231 A | 3/2000 | Yang | |
| 6,180,966 B1 | 1/2001 | Kohno et al. | |
| 6,461,900 B1* | 10/2002 | Sundaresan et al. | 438/156 |
| 7,122,860 B2* | 10/2006 | Peake et al. | 257/339 |
| 2003/0170955 A1 | 9/2003 | Kawamura et al. | |
| 2004/0212006 A1* | 10/2004 | Harari et al. | 257/315 |
| 2005/0001258 A1* | 1/2005 | Forbes | 257/314 |
| 2005/0173758 A1 | 8/2005 | Peake et al. | |
| 2005/0219881 A1* | 10/2005 | Lurkens | 363/132 |
| 2006/0049462 A1 | 3/2006 | Ju | |
| 2006/0273386 A1* | 12/2006 | Yilmaz et al. | 257/330 |

FOREIGN PATENT DOCUMENTS

| | | |
|---|---|---|
| EP | 1094525 | 4/2001 |
| GB | 2331841 | 6/1999 |
| WO | 9011616 | 10/1990 |
| WO | 9812753 | 3/1998 |
| WO | 2004114410 | 12/2004 |

OTHER PUBLICATIONS

Office Action relative to U.S. Appl. No. 11/771,375 mailed Dec. 1, 2010.

Final Office Action relative to U.S. Appl. No. 11/771,375 mailed Apr. 28, 2011.

"Smart High-Side Power Switch Four Channels: 4 × 25 mΩ IntelliSense" Infineon Technologies, BTS 5440G, Jun. 3, 2006.

Office Action relative to U.S. Appl. No. 13/193,116 mailed May 10, 2012.

* cited by examiner

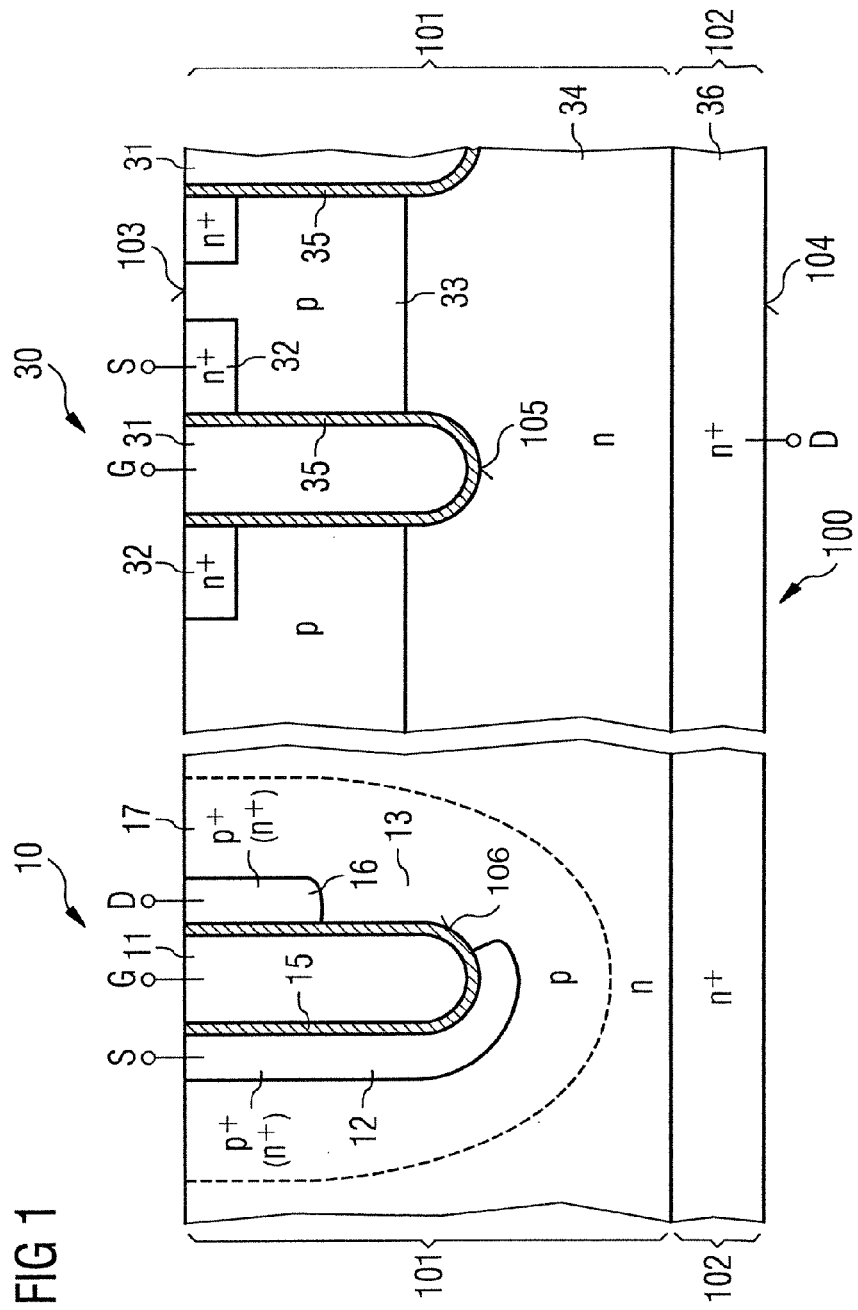

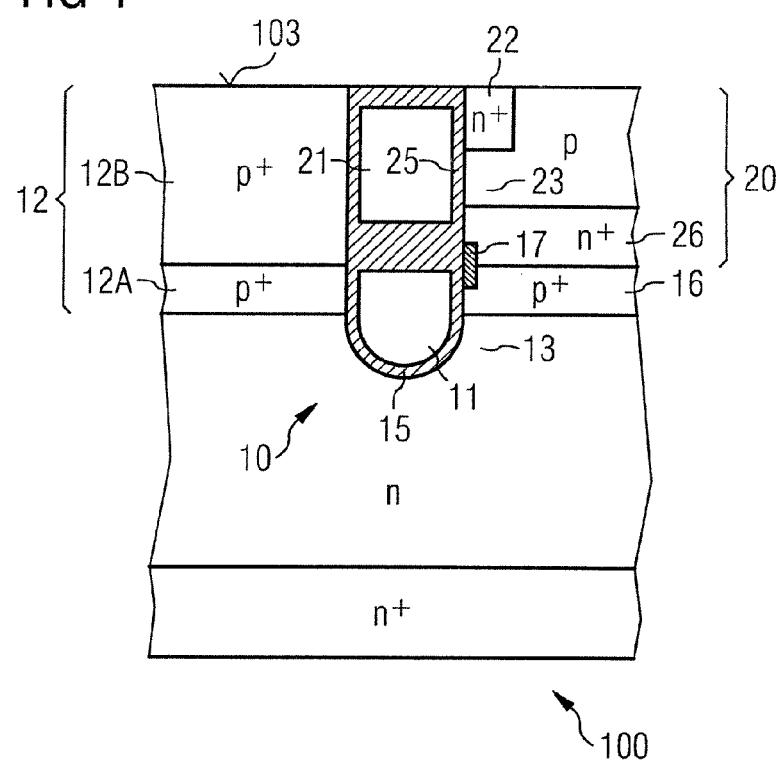

SEMICONDUCTOR COMPONENT ARRANGEMENT AND METHOD FOR PRODUCING THEREOF

CROSS-REFERENCE TO RELATED APPLICATIONS

This Utility patent application is a divisional application of U.S. application Ser. No. 13/193,116, filed Jul. 28, 2011, which is a divisional application of U.S. application Ser. No. 11/771,375, filed Jun. 29, 2007, and claims priority to German Patent Application No. DE 10 2006 030 631.7 filed on Jul. 3, 2006, which are incorporated herein by reference.

BACKGROUND

The present invention relates to a semiconductor component arrangement, in particular a semiconductor component arrangement including at least one power component and at least one logic component. The invention further relates to a method for producing a semiconductor component arrangement.

"Intelligent" power semiconductor components include not only a power component, such as, for example, a power MOSFET or a power IGBT, but also logic circuits for driving the power components. Particularly when power components are used for complex switching and regulating operations such as occur for example in switching converters or in motor driving circuits, complicated driving circuits are required for driving the power components. Said driving circuits are realized by logic components and may contain both control functions and protection functions for the power semiconductor component.

The driving circuit including logic components and the at least one power component can be integrated together in a semiconductor body/semiconductor chip. In the case of such intelligent power semiconductor components, the logic components are usually realized as planar components, which is space-consuming. Added to this is the space requirement for the connecting channels between the individual logic components' circuit blocks and the space requirement for the wiring channels in the logic gates.

SUMMARY

A semiconductor arrangement according to one example includes at least one power semiconductor component integrated in a semiconductor body and at least one logic component integrated in the semiconductor body. The logic component has a trench extending into the semiconductor body proceeding from a first side, at least one gate electrode arranged in the trench and insulated from the semiconductor body by a gate dielectric, at least one source zone and at least one drain zone of a first conduction type, which are formed in the semiconductor body in a manner adjacent to the gate dielectric and in a manner spaced apart from one another in a peripheral direction of the trench and between which at least one body zone of a second conduction type is arranged.

In this semiconductor arrangement logic gates are not produced in planar technology, but rather are arranged in a vertical direction around the trenches or along the trenches that also accommodate the gate electrodes of the power transistors. In this case the current flows from the source on one side of the trench around the bottom of the trench to the other side of the trench to the drain or along a longitudinal direction of the trench from source to drain. In another configuration, the current flow direction is parallel to a side wall of the trench.

The logic gate trenches may be produced in the same process as the gate trenches of the power transistor. In this case, the width and the depth of the trenches for the logic gates are identical or similar to the trenches for the power transistors.

Another example relates to a semiconductor component arrangement including a semiconductor body and at least one logic component integrated in the semiconductor body. The logic component includes a trench extending into the semiconductor body, at least one gate electrode arranged in the trench and insulated from the semiconductor body by a gate dielectric, at least on source zone and at least one drain zone of a first conducting type, which are formed in a semiconductor body in a manner adjacent to the gate dielectric and in a manner spaced apart from one another in peripheral direction of the trench and between which at least one body zone of a second conduction type is arranged.

A further example relates to a method for producing a semiconductor component arrangement, in particular a logic semiconductor component arrangement. The method includes providing a semiconductor body having a first side and a second side and having a doped zone of a first conduction type, producing at least one trench in the doped zone proceeding from the first side, producing at least one drain zone and at least one source zone in such a way that they are arranged in the doped zone around the trench and in a manner adjoining the trench and are separated from one another by a body zone, producing a dielectric layer in the trench, producing at least one gate electrode in the trench, said at least one gate electrode being arranged adjacent to the at least one body.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 1 illustrates a semiconductor component arrangement including a trench power transistor integrated in a semiconductor body and including a logic transistor arranged along a trench of the semiconductor body.

FIG. 4 illustrates a further exemplary realization of a CMOS inverter realized along a trench of a semiconductor body.

DETAILED DESCRIPTION

Figure 2A:
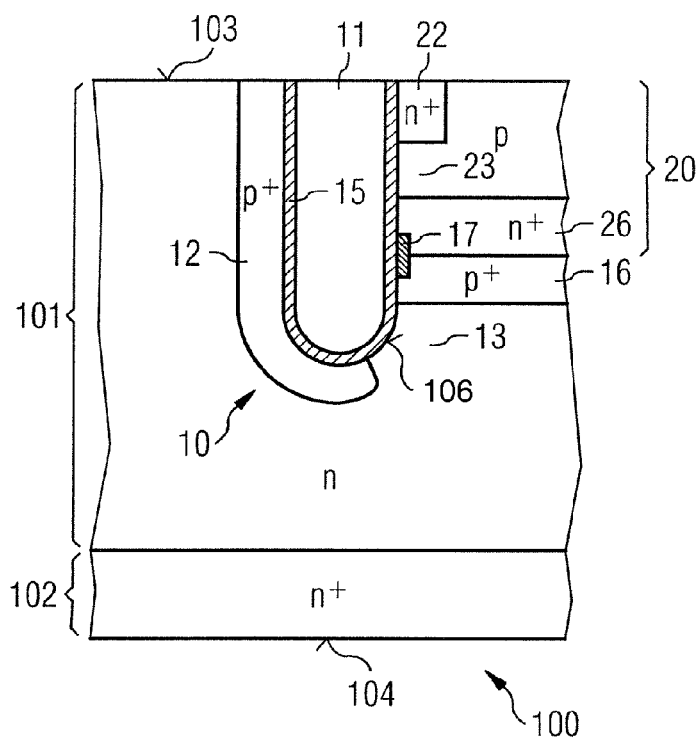
FIGS. 2A and 2B illustrates a CMOS inverter realized along a trench of a semiconductor body and including a PMOS and an NMOS transistor.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

In the figures, unless specified otherwise, identical reference symbols designate identical component regions with the same meaning.

FIG. 1 illustrates in side view in cross section an example of a semiconductor component arrangement having at least one power semiconductor component and at least one logic component which are integrated in a common semiconductor body. In the example, the power semiconductor component is realized as a trench MOSFET 30 and the logic component is realized as a logic transistor 10.

The semiconductor body 100 has a highly doped semiconductor layer 102, which is realized for example by a semiconductor substrate, and a more weakly doped semiconductor layer 101, which is applied to the highly doped semiconductor layer 102 and is realized for example as an epitaxial layer. The epitaxial layer forms a first side 103 of the semiconductor body 100, which is referred hereinafter as the front side, while the semiconductor substrate 102 forms a second side 104, which is referred hereinafter as the rear side.

The trench power transistor has a trench 105, which extends into the semiconductor body 100 proceeding from the front side 103 and in which is arranged a gate electrode 31, which is dielectrically insulated from semiconductor regions of the semiconductor body 100 by a gate dielectric 35. The trench with the gate electrode 31 in this case extends from a source zone 32 arranged in the region of the front side 103 through a body zone 33 right into a drift zone 34. The source zone 32, the body zone 33 and the drift zone 34 are in this case arranged in the epitaxial layer 101 of the semiconductor body 100, the source zone 32 and the drift zone 34 being doped complementarily with respect to the body zone 33. The semiconductor substrate 102 in the region of the trench power transistor forms the drain zone 36 which forms an external drain contact D of the trench MOSFET. The gate electrode 31 serves for controlling a conductive channel in the body zone 33 between the source zone 32 and the drift zone 34 in a known manner upon application of a suitable driving potential.

The trench power transistor may have, in a manner known in principle, a multiplicity of structures of identical type each having a gate electrode 31 arranged in a trench 105. Said structures of identical type are referred to as "transistor cells" and are connected in parallel in order to increase the current-carrying capacity of the power component, that is to say that the individual source zones 32 are in each case connected to one another, and the individual gate electrodes 31 are in each case electrically conductively connected to one another. The drain zone 36 is common to all of the transistor cells in this case.

The trench power MOSFET 30 illustrated in FIG. 1 is realized as an n-channel MOSFET. In this case, the source zone 32, the drift zone 34 and the drain zone 36 are n-doped, while the body zone 33 is p-doped. It goes without saying that the present invention is not restricted to the realization of an n-channel MOSFET, but rather can also be applied in the same way to p-channel MOSFETS or IGBTs. A p-channel MOSFET is obtained if the component zones of the trench MOSFET are doped complementarily with respect to the dopings illustrated in FIG. 1. An IGBT is obtained by doping the drain zone 36 complementarily with respect to the drift zone 34.

In the case of the semiconductor component arrangement, at least one logic component 10 is realized in the same semiconductor body 100 as the trench power MOSFET 30, said logic component being realized as a logic transistor in FIG. 1. Logic components differ from power components by virtue of their dielectric strength, which may amount to tens of v and up to a few 100 V in the case of power components, while the dielectric strength of logic components is in the region of a few volts. The high dielectric strength of a power transistor in comparison with the lower dielectric strength of a logic transistor is achieved by virtue of the fact that, in the case of a power transistor, a drift zone that is more lightly doped than the drain zone is present adjacent to the drain zone, said drift zone being able to take up a propagating space charge zone in the event of the component being driven in the off state. No such drift zone is present in the case of logic transistors.

The logic transistor 10 illustrated has a trench 106, in which a gate electrode 11 of the logic transistor 10 is arranged. Said gate electrode 11 is dielectrically insulated from semiconductor regions of the semiconductor body 100 by a gate dielectric 15. The logic transistor 10 additionally has a source zone 12 and a drain zone 16, which are in each case arranged in a manner directly adjacent to the gate dielectric 15, and which are arranged in a manner spaced apart from one another along a periphery of the trench 106. In this case, the periphery of the trench denotes a region which extends through the semiconductor body 100 from one side to the other side of the trench. In the case of this logic transistor 10, the source zone 12 extends on one side of the trench as far as the front side 103, where it can be contact-connected by a terminal electrode (not illustrated), while the drain zone 16 extends on the opposite side of the trench as far as the front side 103, where it can be contact-connected by a terminal electrode (not illustrated). The gate electrode 11 of the logic transistor 10 serves for controlling a conductive inversion channel between the source zone 12 and the drain zone 16 in a body zone 13 along the gate dielectric 15.

The trench 106 with the gate electrode 11, the source zone 12 and the drain zone 16 of the logic transistor in accordance with FIG. 1 are arranged in the epitaxial layer 101 of the semiconductor body 100. The transistor is a p-conducting transistor in the example. In this case, the source zone 12 and the drain zone 16 of the transistor are p-doped, while the body zone 13 is n-doped and formed by a portion having a basic doping of the n-doped epitaxial layer 111.

An n-conducting transistor can be realized in the n-doped epitaxial layer 111 in accordance with FIG. 1 by providing a semiconductor zone 17 (illustrated by dashed lines) doped complementarily with respect to the epitaxial layer 101, the trench with the gate electrode 11 and also the source and drain zones 12, 16 being arranged in said semiconductor zone. In this example, the source and drain zones 12, 16 are n-doped (as indicated in parentheses in FIG. 1), and the body zone 13 is formed by a portion of a p-doped semiconductor zone 17 in the case of this component.

The component properties of the logic transistor 10 illustrated in FIG. 1 are essentially determined by the channel length of said transistor. Said channel length corresponds to the distance between the source zone 12 and the drain zone 16 along the periphery of the trench 106. The setting of said distance, and hence the channel length, will be explained below with reference to FIG. 4.

The dimensions, in particular the depth, of the trench 105 of the trench power transistor 30 and of the trench 106 of the logic transistor 10 may be identical. This enables the trench of the trench power transistor 30 and the trench of the logic transistor 10 to be produced simultaneously.

The realization of the logic transistor 10 including a gate electrode 11 in a trench 106 and including source, body and drain zones 12, 13, 16 along said trench enables a logic transistor having a small area requirement relative to the area of the semiconductor body 100. It should be pointed out that the logic transistor 10 in FIG. 1 is only representative of a multiplicity of logic transistors that can be realized in the semiconductor body 100. These logic transistors can be electrically interconnected with one another by using interconnects above the front side 103, in a manner that is not specifically illustrated, in order thereby also to realize complex driving circuits for the power transistor 30. Furthermore, there is also the possibility of the individual logic transistors being electrically conductively connected to one another by interconnects arranged in further trenches (not illustrated) of the semiconductor body.

It should be noted, that the logic transistor 10 and logic transistors explained in the following are not limited to be integrated in a semiconductor body including a power semiconductor component. Instead those logic transistors may be integrated together with other logic components in one semiconductor body, or may even be the only semiconductor components in a semiconductor body.

FIG. 2A illustrates an exemplary realization of a CMOS inverter having a series circuit formed by a PMOS transistor 10 and an NMOS transistor 20. The two transistors have a common gate electrode 11 arranged in a trench 106 extending into the semiconductor body 100 proceeding from the front to the side 103. Said gate electrode 11 is dielectrically insulated from semiconductor regions of the semiconductor body 100 by a gate dielectric 15. The PMOS transistor 10 and the NMOS transistor 20 respectively have a source zone 12, 22 and a drain zone 16, 26, which are in each case arranged directly adjacent to the gate dielectric 15 in the semiconductor body 100. The source zones 12, 22 and the drain zones 16, 26 of these two transistors are respectively separated from one another by a body zone 13, 23, which are likewise directly adjacent to the gate dielectric 15. In the case of the exemplary embodiment illustrated in FIG. 2A, the epitaxial layer 101 in which the CMOS inverter is arranged has an n-type basic doping. In this case, the body zone 13 of the PMOS transistor 10 is formed by a portion having the basic doping of the epitaxial layer 101. In the example, the drain zone 16 of the PMOS transistor 10 and the drain zone 26 of the NMOS transistor 20 are directly adjacent to one another and are short-circuited with one another by a short-circuiting zone 17 that makes contact with the two drain zones 16, 26. Said short-circuiting zone 17 is composed of a suitable material for producing an electrically conductive connection between the mutually complementarily doped drain zones 16, 26, for example of a metal or a silicide.

Figure 2B:
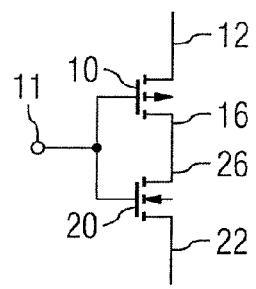

FIG. 2B illustrates the electrical equivalent circuit diagram of the CMOS inverter illustrated in FIG. 2A. In this case, the terminals of the two transistors 10, 12 illustrated in the electrical equivalent circuit diagram are identified by the same reference symbols as the component regions in FIG. 2A by which the individual transistor zones are formed.

It should be pointed out that the illustration of the power semiconductor component is dispensed with in FIG. 2A for reasons of clarity. Said power semiconductor component can be realized according to the trench power MOSFET in FIG. 1 and is arranged in the same semiconductor body 100 as the CMOS inverter.

In the case of the inverter in accordance with FIG. 2, depending on an electrical potential present at the gate electrode 11 during operation, an inversion channel forms either in the body zone 13 of the PMOS transistor 10 or in the body zone 23 of the NMOS transistor 20 (or in the neither of the two transistors 10, 20).

Figure 3A:
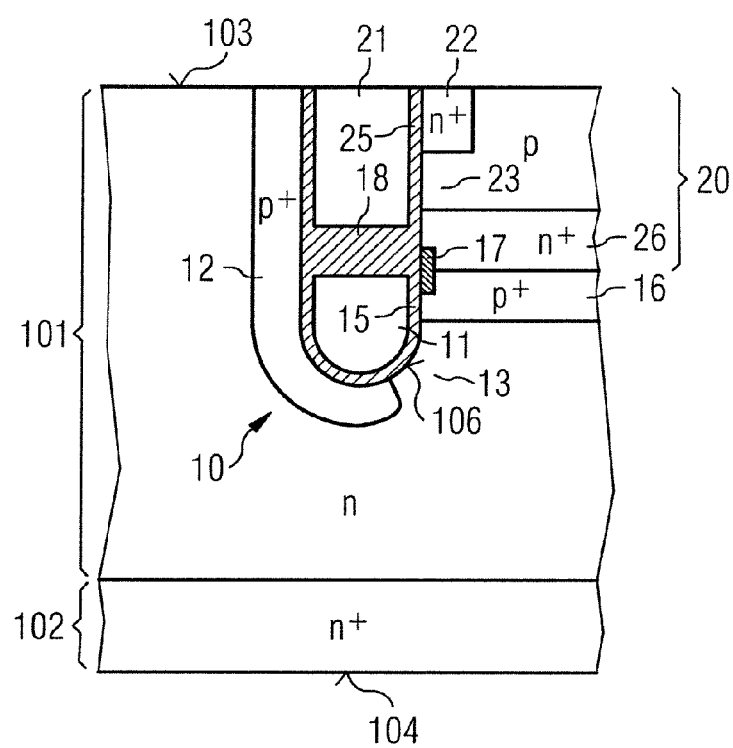
FIGS. 3A and 3B illustrates a further exemplary realization of a CMOS inverter realized along a trench of a semiconductor body.

FIG. 3A illustrates a CMOS inverter, which differs from the one illustrated in FIG. 2 by virtue of the fact that the two transistors 10, 20 have separate gate electrodes 11, 21. In this case, the two gate electrodes 11, 21 are arranged one above another in the trench 106 in a vertical direction of the semiconductor body 100 and are electrically insulated from one another by an insulation layer 18. The first gate electrode 11 of the PMOS transistor 10 is insulated from the semiconductor body 100 by a first gate dielectric layer 15, while the second gate electrode of the NMOS transistor 20 is dielectrically insulated from the semiconductor body 100 by a second gate dielectric layer 25. The gate electrode 11 of the PMOS transistor 10 is composed of a highly p-doped polysilicon, for example, while the gate electrode 21 of the NMOS transistor 20 is composed of a highly n-doped polysilicon, for example.

In the case of this CMOS inverter, the body zones 13, 23 of the two logic transistors 10, 20 are arranged in a manner spaced apart from one another in a vertical direction of the semiconductor body 100. In this case, the source, body and drain zones 22, 23, 26 of the NMOS transistor 20 are arranged in such a way that the second gate electrode 21 extends, in a manner insulated by the second gate dielectric 25, from the source zone 22 along the body zone 23 are far as the drain zone 26. Correspondingly, the source zone 12, the body zone 13 and the drain zone 16 of the PMOS transistor 10 are arranged relative to the first gate electrode 11 in such a way that the latter extends from the source zone 12 along the body zone 13 as far as the drain zone 16. The source zone 12 of the PMOS transistor 10 extends on one side of the trench as far as the front side 103, where it can be contact-connected by using a terminal electrode, while the source zone 22 of the NMOS transistor 20 extends on the opposite side of the trench as far as the front side 103, where it can be contact-connected by using a terminal electrode. The source zone 12 of the PMOS transistor 10 extends in portions along the second gate electrode 21, but this has no influence on the electrical function of the PMOS transistor 10. The drain zones 16, 26 of the two transistors 10, 20 are directly adjacent to one another and are electrically conductively connected to one another by the short-circuiting zone 17.

Figure 3B:
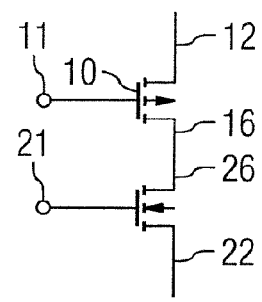

The electrical equivalent circuit diagram of the CMOS inverter illustrated in FIG. 3A is illustrated in FIG. 3B, the terminals of the equivalent circuit diagram in FIG. 3B being identified by reference symbols corresponding to those of the component regions in FIG. 3A by which they are formed.

FIG. 4 illustrates a further exemplary realization of a CMOS inverter including two gate electrodes 11, 21 arranged one above another in a vertical direction in a trench 106 of the semiconductor body 100. In the case of this inverter, the source zone 12 and the drain zone 16 of the PMOS transistor 10 are arranged approximately at the same level in a vertical direction of the semiconductor body 100. the body zone 23 of the PMOS transistor 10 extends from the source zone 12A around the lower end of the trench as far as the drain zone 16. The NMOS transistor 20 is arranged on one of the trench sidewalls, and its source zone 22, body zone 13 and drain zone 26 are arranged on side of the trench 106 in a manner lying one above another in a vertical direction of the semiconductor body. On the opposite side of the trench to the NMOS transistor 20, the source zone 12 extends as far as the front side 101 of the semiconductor body, where it can be contact-connected by using a terminal contact. The source zone 22 of the NMOS transistor 20 is arranged in the region of the front side 103 of the semiconductor body 100, where it can be contact-connected by using a terminal contact.

The drain zone 16 of the PMOS transistor 10, the drain zone 26 of the NMOS transistor and also the body zone 23 of the NMOS transistor are arranged in a manner lying one above another in a vertical direction of the semiconductor body 100. These semiconductor zones can be produced using an implantation method, for example, in which dopant atoms are implanted with different implantation energies, and thereby into different depths of the semiconductor body. The source zone 12 can have two source zone portions 12A, 12B, wherein a lower one of these two source zone portions 12A can be produced during the same implantation method as the drain zone 16 of the PMOS transistor 10. In the case of the CMOS inverter illustrated in FIG. 4, the channel length of the PMOS transistor 10 is determined by the width of the trench, the depth of the trench and also the implantation depth of the source and drain zones 12, 16 of the PMOS transistor. The channel length of the NMOS transistor 20 is determined by the implantation energies during the production of the individual component regions of the NMOS transistor 20, that is to say by the distance between the source and drain zones 12, 26.

A production method for producing a logic transistor that is arranged along a periphery of a trench of a semiconductor 100 is explained below with reference to FIGS. 5A to 5D.

Figure 5A:
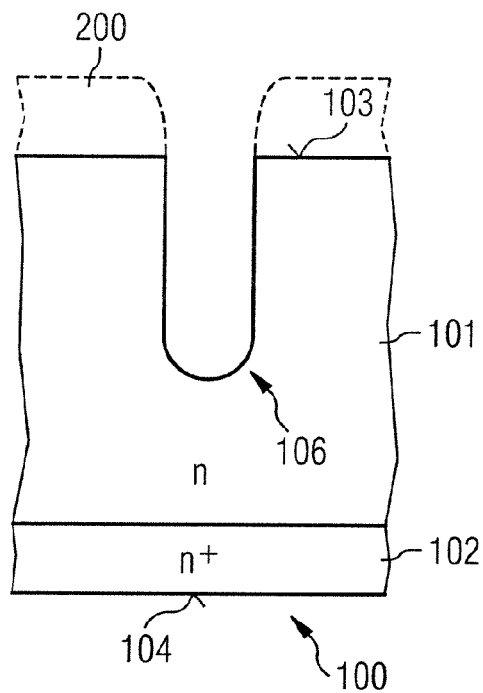
FIGS. 5A-5D illustrates a method for producing a logic transistor arranged along a trench for the semiconductor body on the basis of cross sections through the semiconductor body during various method processes.

FIG. 5A illustrates the semiconductor body 100 after first method processes have been carried out for producing a trench 106 extending into the semiconductor body 100 proceeding from the front side 103. Said trench can be produced using conventional method processes using a patterned etching mask 200 (illustrated by dashed line) and an etching method.

Figure 5B:
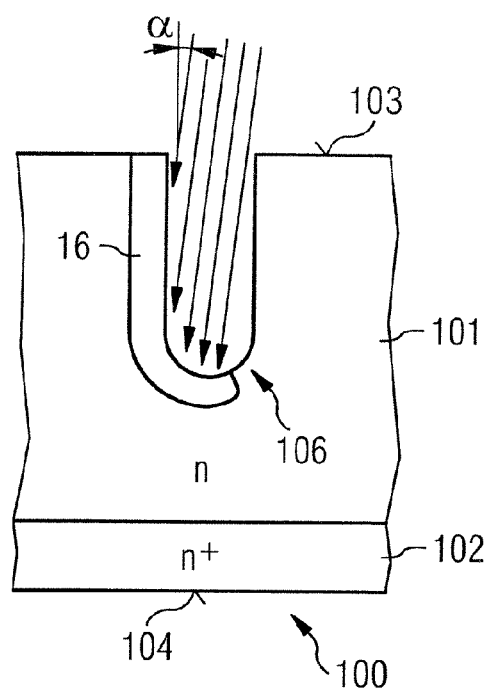

Referring to FIG. 5B, the production of the trench 106 is followed by method processes for producing one of the drain or source zones of the logic transistor. For this purpose, dopant atoms are implanted into the semiconductor body 100 via the trench 106. In this case, the implantation is effected at an angle not equal to 90° relative to the front side 103 or not equal to 0° relative to the vertical. What is achieved as a result of this is that, during this implantation step, dopant atoms are only implanted into predetermined portions of the semiconductor body 100 via sidewalls of the trench 106, while other portions are omitted from the implantation in a manner shielded by the edges of the trench in the region of the front side 103. Prior to the implantation, a protective layer is preferably applied to the front side 103 of the semiconductor body in order that dopant atoms are implanted into the semiconductor body in a targeted manner only via the trench 106. Said protective layer, which is not specifically illustrated in FIG. 5B, may for example be the etching mask (200 in FIG. 5A) used for the etching of the trench.

Figure 5C:
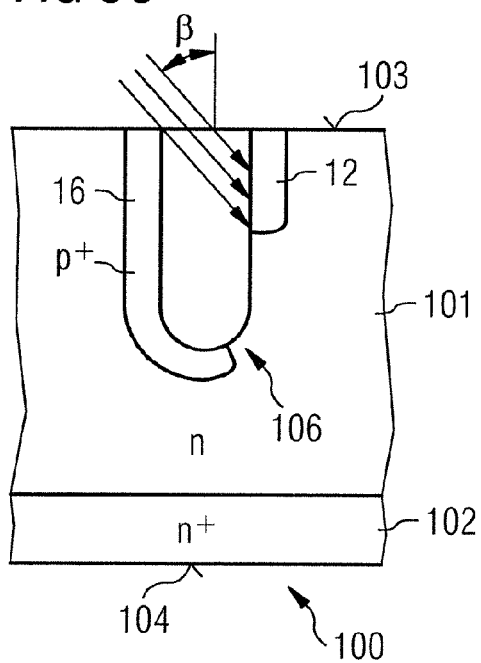

In order to produce the further one of the drain and source zones, referring to FIG. 5C, a further implantation process is effected, in which dopant atoms are implanted into the semiconductor body 100 via the trench 106. This implantation is likewise effected at an angle not equal to 90° relative to the front side 103 at an angle not equal to 0° relative to the vertical. In this case, the two implantation angles $\alpha$, $\beta$ differ from one another, such that, during the two implantation processes, the dopant atoms are implanted into different regions of the semiconductor body along the periphery of the trench. In the second implantation step, too, which is illustrated in FIG. 5C, the implantation is preferably effected using a protective layer (not illustrated) applied to the front side 103.

Figure 5D:
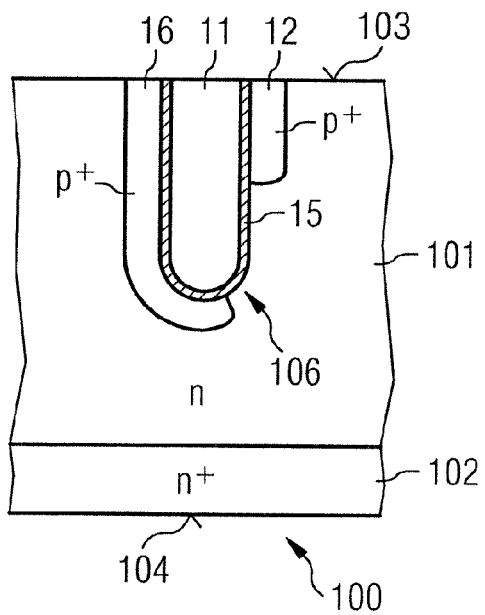

Referring to FIG. 5D, the gate dielectric 15 is subsequently produced on the uncovered surface of the trench 106, and the trench is subsequently filled with an electrode material for producing the gate electrode 11. The gate dielectric 15 is a semiconductor oxide, for example, which can be produced by a thermal oxidation step. The gate electrode 11 is a highly doped polysilicon, for example, with which the trench is filled in order to produce the gate electrode 11.

In an alternative (not specifically illustrated) to the method explained above, the production of the source zone 12, which is only arranged in a region of the semiconductor body 100 located near the front side 103, is effected only after the production of the gate dielectric 15 and the gate electrode 11 by implantation and/or diffusion of dopant atoms via the front side 103.

Instead of producing the source and drain zones 12, 22, 16, 26 by an implantation of dopant atoms, there is also the possibility, in a manner that is not specifically illustrated, of producing these component zones by the trench sidewalls being covered with the material containing dopant atoms and dopants being indiffused from said material into the semiconductor body 100.

Figure 6:
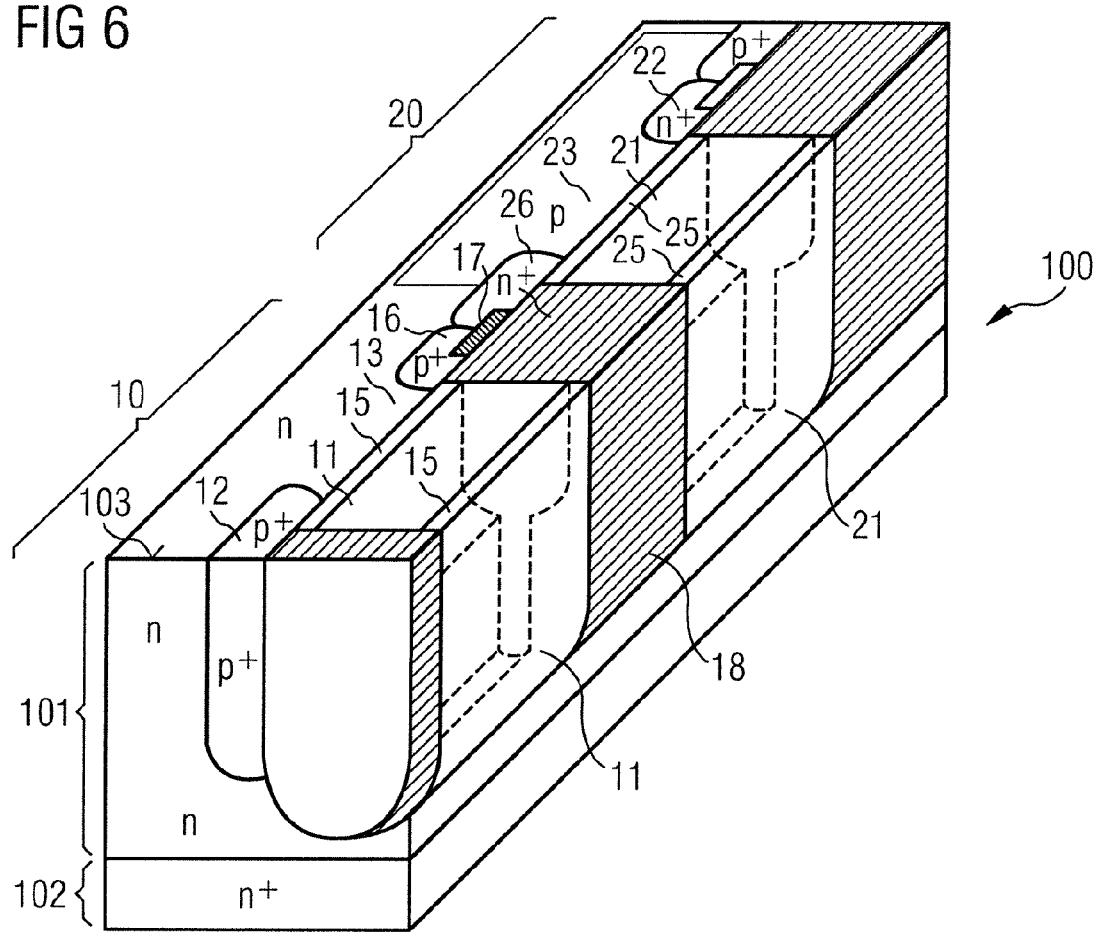
FIG. 6 illustrates one embodiment of a CMOS inverter.

FIG. 6 illustrates a further exemplary realization of a CMOS inverter having two mutually complementary transistors, a PMOS transistor 10 and an NMOS transistor 20. The two transistors 10, 20 respectively have a gate electrode 11, 21, which, proceeding from a front side 103 of the semiconductor body 100 in which the transistors 10, 20 are integrated, extend into the semiconductor body 100. Said gate electrodes 11, 21 are respectively dielectrically insulated from semiconductor regions of the semiconductor body 100 by a gate dielectric 15, 25. The gate electrode 11 of the PMOS transistor is composed of highly p-doped polysilicon, for example, while the gate electrode 21 of the NMOS transistor is composed of a highly n-doped polysilicon, for example. Each of the two transistors 10, 20 has a source and drain zone 12, 16 and 22, 26, respectively, which are adjacent to the gate dielectric 15, 25 of the respective transistor 10, 20 at least in portions, and which are arranged in a manner spaced apart from one another. In the case of the component arrangement illustrated in FIG. 6, the source and drain zones 12, 16 and 22, 26 are arranged in a manner spaced apart from one another in a longitudinal direction of the trenches in which the gate electrodes 11, 21 are arranged. In this case, the gate electrodes 11, 21 are arranged one behind the other in the longitudinal direction of said trenches and are insulated from one another by an insulation layer 18, for example a semiconductor oxide. It should be pointed out in this connection that for realizing the gate electrodes 11, 21 it is possible to provide a common trench in which the two gate electrodes 11, 21 are produced and are insulated from one another by the insulation layer 18. The trenches with the gate electrodes 11, 21 arranged therein extend in two horizontal directions—running perpendicular to one another—of the semiconductor body 100 and in a vertical direction of the semiconductor body 100. In this case, the longitudinal direction of the trenches corresponds to that one of the two horizontal directions in which the trenches have the larger extent.

The source and drain zones of the two transistors 10, 20 are respectively separated from one another by body zones 13, 23 which are doped complementarily with respect to the source and drain zones and in which, upon suitable driving of the gate electrodes 11, 21, an inversion channel forms along the gate dielectrics 15, 25 between the source and drain zones 12, 16 and 22, 26, respectively.

The drain zone 26 of the NMOS transistor 20 and the drain zone 16 of the PMOS transistor are short-circuited in the region of the insulation layer 18 by using an electrically conductive layer, for example a metal or a silicide.

Even though the realization of logic transistors with source and drain zones which are arranged in a manner spaced apart from one another in a longitudinal direction of the gate trench has been explained for a CMOS inverter with reference to FIG. 6, it should be pointed out that the invention is not, of course, restricted to the realization of CMOS inverters, rather it is possible to realize any logic circuits with PMOS and MMOS transistors of the type illustrated in FIG. 6.

Figure 7:
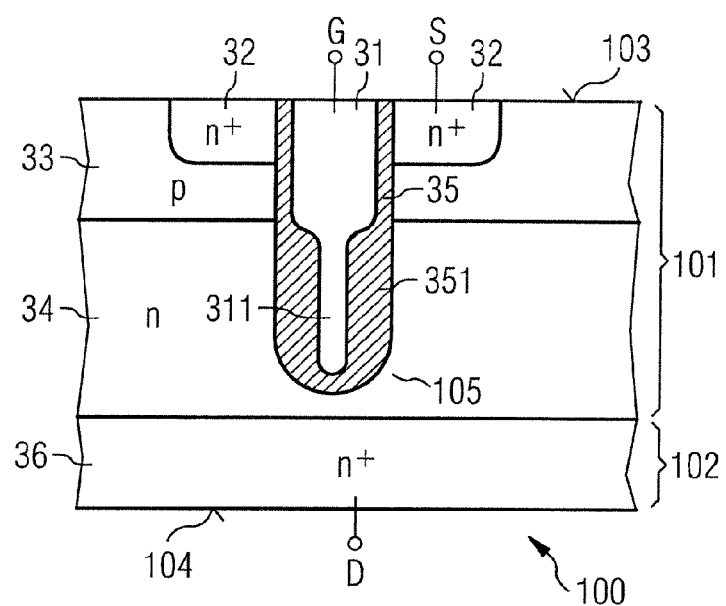
FIG. 7 illustrates a cross section of one embodiment of a power transistor.

The gate electrodes 11, 21 of the transistors 10, 20 illustrated in FIG. 6 have two electrode portions, a first portion in the upper region of the trench, which forms the actual gate electrode and which is separated from the source, drain and body zones by the gate dielectric 15, and a field plate portion in the lower region of the trench. The geometries of said gate electrodes 11, 21 thus correspond to the geometry of the gate electrode 31 of the power transistor realized in the same semiconductor body 100 as the logic transistors 10, 20. A cross section through this power transistor is illustrated in FIG. 7.

This power transistor differs from the power transistor illustrated in FIG. 1 by virtue of the geometry of the gate electrode 31, which has a field electrode 311 in the lower region of the trench adjacent to the drift zone 34, said field electrode being dielectrically insulated from the semiconductor body by a dielectric layer 351 that is thicker than the gate dielectric 35. Said field electrode 311 has, in a known manner, with the power transistor driven in the off state, a compensation effect on the dopant charge present in the region of the drift zone 334. Said compensation effect makes it possible, in a known manner, for a given doping concentration of the drift zone 34, to increase the reverse voltage or, for a given reverse voltage, to increase the doping concentration in the drift zone 34, which results in a reduction of the on resistance of the power component.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component arrangement comprising at least one power semiconductor component and at least one logic component integrated in a semiconductor body having a first side, the logic component comprising:
    a trench extending into the semiconductor body proceeding from the first side;
    at least one gate electrode arranged in the trench and insulated from the semiconductor body by a gate dielectric;
    a first source zone and a first drain zone of a first conduction type, which are formed in the semiconductor body in a manner adjacent to the gate dielectric and in a manner spaced apart from one another in a peripheral direction of the trench and between which a first body zone of a second conduction type is arranged; and
    at least a second source zone and at least a second drain zone that are separated from each other by a second body zone and formed along the trench, wherein the first and second drain zones are electrically conductively connected to one another via a short-circuiting zone, and wherein the at least one gate electrode comprises a first gate electrode and a second electrode vertically set and isolated from one another by the gate dielectric.

2. The semiconductor component arrangement of claim 1, wherein the first gate electrode is arranged adjacent to the first body zone and the second gate electrode is arranged adjacent to the second body zone.

3. The semiconductor component arrangement of claim 1,
    wherein the first drain zone, the first body zone and the first source zone form a first transistor,
    wherein the second drain zone, the second body zone and the second source zone form a second transistor, and
    wherein the first and the second transistor are connected to form a transistor half-bridge or a CMOS inverter.

4. The semiconductor component arrangement of claim 1, wherein the first MOS transistor is of a first type, and the second MOS transistor is of a second type which is complementary to the first type.

5. A semiconductor component arrangement comprising at least one power semiconductor component integrated in a semiconductor body and at least one logic component integrated in the semiconductor body, the logic component comprising:
    a trench extending into the semiconductor body proceeding from a first side;
    at least one gate electrode arranged in the trench and insulated from the semiconductor body by a gate dielectric;
    a first source zone and a first drain zone of a first conduction type, which are formed in the semiconductor body in a manner adjacent to the gate dielectric and in a manner spaced apart from one another in a longitudinal direction of the trench and between which a first body zone of a second conduction type is arranged; and
    at least a second source zone and at least a second drain zone that are separated from each other by a second body zone and formed along the trench, wherein the first and second drain zones are electrically conductively connected to one another via a short-circuiting zone, and wherein the at least one gate electrode comprises a first gate electrode and a second electrode vertically offset and isolated from one another by the gate dielectric.

6. A semiconductor component arrangement comprising at least one logic component integrated in a semiconductor body, having a first side, the logic component comprising:
    a trench extending into the semiconductor body proceeding from the first side;
    at least one gate electrode arranged in the trench and insulated from the semiconductor body by a gate dielectric;
    a first source zone and a first drain zone of a first conduction type, which are formed in the semiconductor body in a manner adjacent to the gate dielectric and in a manner spaced apart from one another in a peripheral direction of the trench and between which a first body zone of a second conduction type is arranged; and
    at least a second source zone and at least a second drain zone that are separated from each other by a second body zone and formed along the trench, wherein the first and second drain zones are electrically conductive connected to one another via short-circuiting zone, and wherein the at least one gate electrode comprises a first gate electrode and a second electrode vertically offset and isolated from one another by the gate dielectric.

7. The semiconductor component arrangement of claim 6, wherein the first gate electrode is arranged adjacent to the first body zone and the second gate electrode is arranged adjacent to the second body zone.

8. The semiconductor component arrangement of claim 6, wherein the power semiconductor component is a trench MOSFET.

9. The semiconductor component arrangement of claim 6, wherein the first drain zone, the first body zone and the first source zone form a first transistor,
wherein the second drain zone, the second body zone and the second source zone form a second transistor, and
wherein the first and the second transistor are connected to form a transistor half-bridge or a CMOS inverter.

10. A semiconductor component body comprising:
a power semiconductor component integrated in the semiconductor body;
a trench extending into the semiconductor body from a first surface;
a first gate electrode and a second gate electrode vertically offset from one another in the trench;
a gate dielectric arranged to insulate the gate electrodes from one another and from the semiconductor body;
a first source zone of a first conduction type in the semiconductor body and adjacent the gate dielectric;
a first drain zone of a first conduction type in the semiconductor body, adjacent the gate dielectric and spaced apart from the source zone in a peripheral direction relative to the trench;
a first body zone of a second conduction type between the first source zone and the first drain zone, wherein the gate electrode, the gate dielectric, the first source zone, the first drain zone and the first body zone together form a first MOS transistor; and
a second source zone, a second drain zone and a second body zone formed along the trench to form a second MOS transistor, the first and second MOS transistors being connected in series, wherein the first and second drain zones are electrically conductively connected to one another via a short-circuiting zone.

11. The semiconductor component body of claim 10, wherein the first and second drain zones are electrically conductively connected to one another such that the first and the second transistor form a transistor half bridge or a CMOS converter.

12. The semiconductor component body of claim 10, wherein the first gate electrode is arranged adjacent to the first body zone and the second gate electrode is arranged adjacent to the second body zone.

\* \* \* \* \*

UNITED STATES PATENT AND TRADEMARK OFFICE
CERTIFICATE OF CORRECTION

PATENT NO. : 8,653,591 B2  
APPLICATION NO. : 13/570710  
DATED : February 18, 2014  
INVENTOR(S) : Markus Zundel et al.

Page 1 of 1

It is certified that error appears in the above-identified patent and that said Letters Patent is hereby corrected as shown below:

In the Claims

Column 10, line 9, Claim 1, delete "set" and insert thereof --offset--.

Signed and Sealed this  
Nineteenth Day of August, 2014

Michelle K. Lee  
*Deputy Director of the United States Patent and Trademark Office*